(12) United States Patent
Farmer

(10) Patent No.: US 9,785,268 B2
(45) Date of Patent: Oct. 10, 2017

(54) ELECTRONIC DEVICE HAVING MULTI-TOUCH INTERFACE FOR SPECTRAL ANALYSIS

(71) Applicant: Coolfire Solutions LLC, St. Louis, MO (US)

(72) Inventor: David P. Farmer, Cuba, MO (US)

(73) Assignee: COOLFIRE SOLUTIONS LLC, St. Louis, MO (US)

( * ) Notice: Subject to any disclaimer, the term of this patent is extended or adjusted under 35 U.S.C. 154(b) by 316 days.

(21) Appl. No.: 13/760,588

(22) Filed: Feb. 6, 2013

(65) Prior Publication Data

US 2013/0207929 A1    Aug. 15, 2013

Related U.S. Application Data

(60) Provisional application No. 61/596,906, filed on Feb. 9, 2012, provisional application No. 61/645,886, filed on May 11, 2012, provisional application No. 61/649,633, filed on May 21, 2012.

(51) Int. Cl.
*G06F 3/041* (2006.01)
*G06F 3/0488* (2013.01)
*G01R 13/02* (2006.01)

(52) U.S. Cl.
CPC .......... *G06F 3/041* (2013.01); *G01R 13/029* (2013.01); *G06F 3/04883* (2013.01); *G06F 2203/04806* (2013.01)

(58) Field of Classification Search
CPC .......... H03K 2217/96011; G06F 3/041; G06F 3/04883
See application file for complete search history.

(56) References Cited

U.S. PATENT DOCUMENTS

| | | |
|---|---|---|
| 7,003,414 B1 | 2/2006 | Wichelman et al. |
| 7,877,698 B1 | 1/2011 | Woodings et al. |
| 2001/0034583 A1* | 10/2001 | Flentov ..................... A61B 5/11 702/142 |
| 2002/0126099 A1* | 9/2002 | Engholm ............... G01R 13/20 345/173 |

(Continued)

OTHER PUBLICATIONS

Int'l Search Report in PCT App No. PCT/US2013/024892 filed Feb. 6, 2013 entitled "Electronic Device Having Multi-Touch Interface for Spectral Analysis".

*Primary Examiner* — Ryan A Lubit
(74) *Attorney, Agent, or Firm* — Milligan PC LLO

(57) ABSTRACT

A electronic device that is operable to communicate with a spectrum analyzer. In one or more implementations, the electronic device includes a touch-sensitive display, the touch-sensitive display configured to receive one or more inputs, a memory operable to store one or more modules, and a processor communicatively coupled to the touch-sensitive display and to the memory. The processor is operable to execute the one or more modules to cause generation of a graphical representation of frequency-domain characteristics of an input signal at the touch-sensitive display. The processor is also operable to execute the one or more modules to dynamically adjust the graphical representation of the frequency-domain characteristics of the input signal at the touch-sensitive display in response to input received at the touch-sensitive display.

1 Claim, 11 Drawing Sheets

(56) References Cited

U.S. PATENT DOCUMENTS

| | | | |
|---|---|---|---|
| 2003/0184593 A1* | 10/2003 | Dunlop | G06F 3/0488 |
| | | | 715/810 |
| 2007/0281609 A1* | 12/2007 | Monte | H04B 7/18513 |
| | | | 455/12.1 |
| 2009/0085555 A1* | 4/2009 | Heerema | G01R 23/18 |
| | | | 324/76.27 |
| 2009/0265126 A1 | 10/2009 | Freidhof | |
| 2010/0156438 A1 | 6/2010 | Gorin | |
| 2012/0092381 A1* | 4/2012 | Hoover | G06F 3/04883 |
| | | | 345/662 |

\* cited by examiner

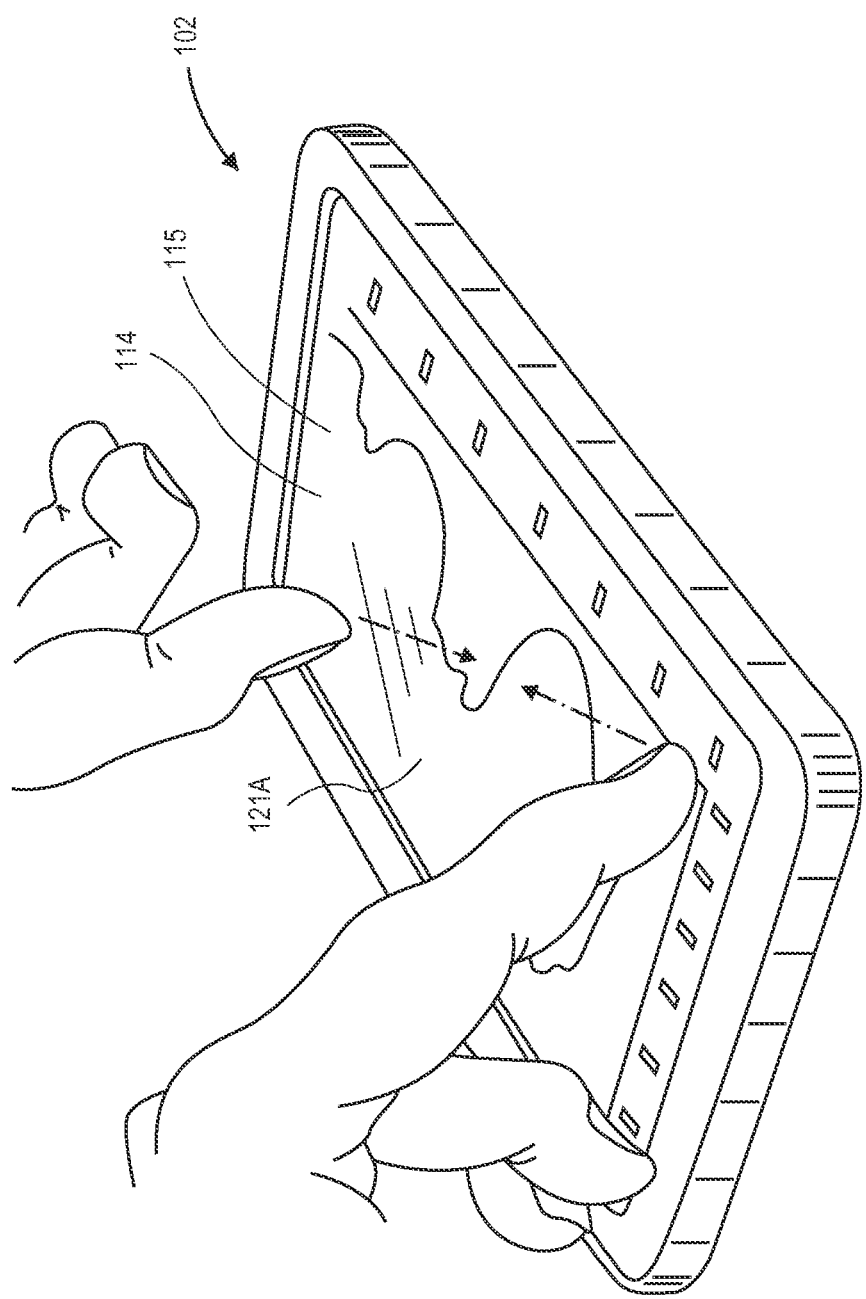

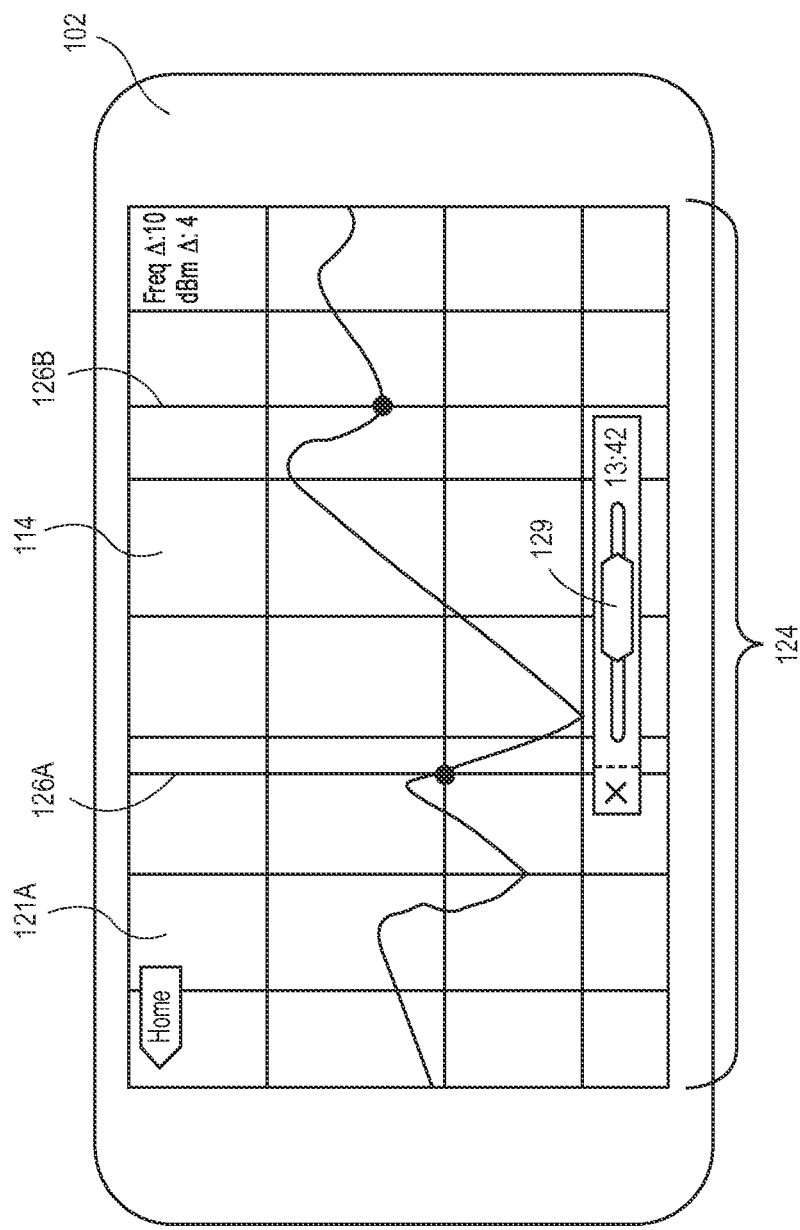

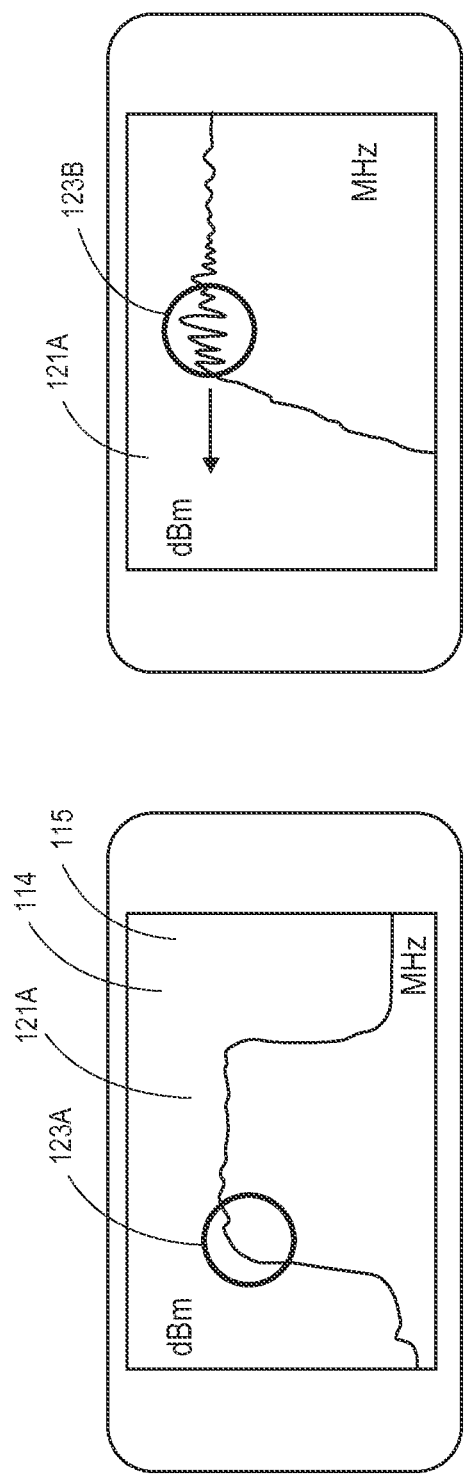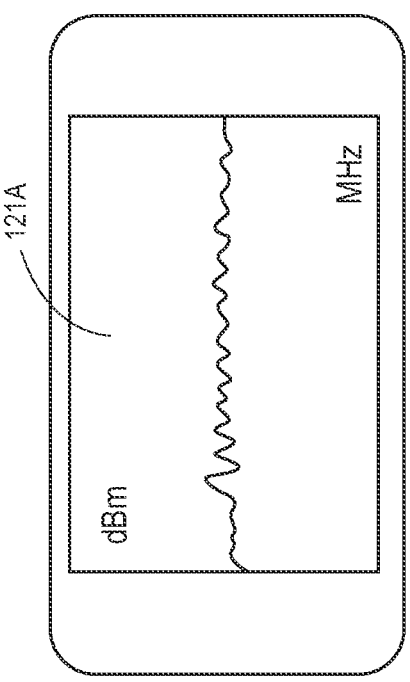
FIG. 1H
FIG. 1G
FIG. 1I

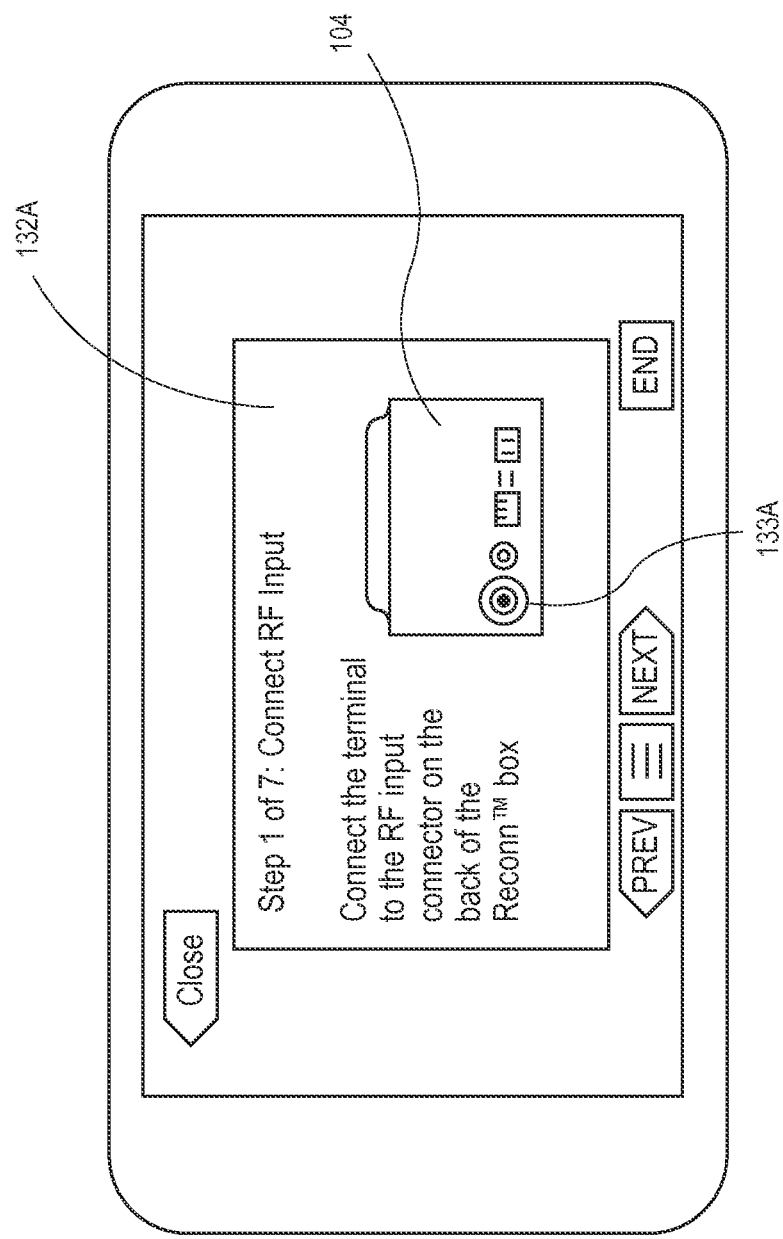

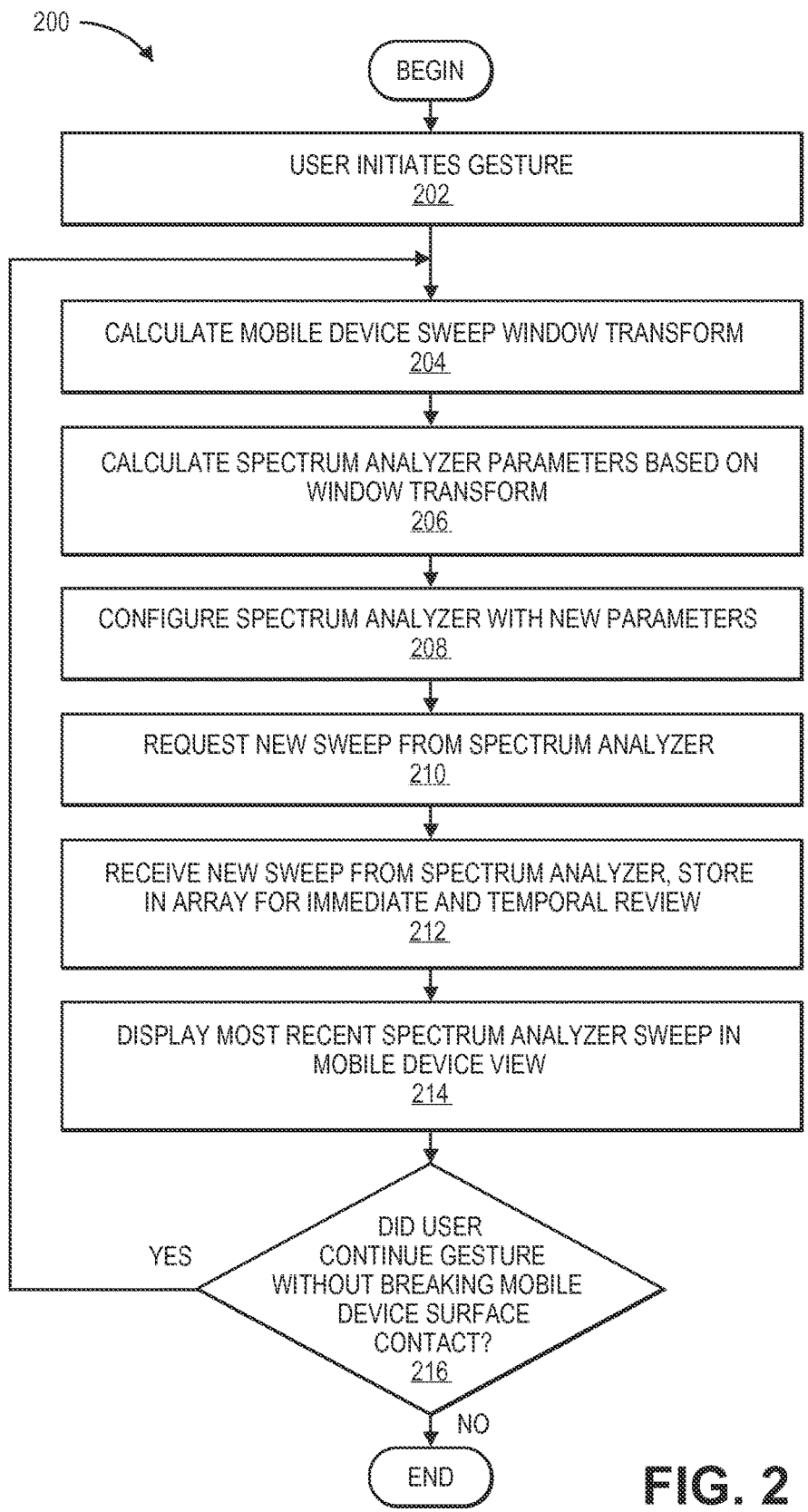

ELECTRONIC DEVICE HAVING MULTI-TOUCH INTERFACE FOR SPECTRAL ANALYSIS

CROSS-REFERENCE TO RELATED APPLICATIONS

The present application claims the benefit under 35 U.S.C. §119(e) of U.S. Provisional Application Ser. No. 61/596,906, entitled ELECTRONIC DEVICE HAVING MULTI-TOUCH INTERFACE FOR SPECTRAL ANALYSIS, filed on Feb. 9, 2012; U.S. Provisional Application Ser. No. 61/645,886, entitled ELECTRONIC DEVICE HAVING MULTI-TOUCH INTERFACE FOR SPECTRAL ANALYSIS, filed on May 11, 2012; and U.S. Provisional Application Ser. No. 61/649,633, entitled ELECTRONIC DEVICE HAVING MULTI-TOUCH INTERFACE FOR SPECTRAL ANALYSIS, filed on May 21, 2012. U.S. Provisional Application Ser. Nos. 61/596,906; 61/645,886; and 61/649,633 are herein incorporated by reference in their entireties.

BACKGROUND

Spectrum analyzers are configured to measure the magnitude of an input signal versus frequency within the full frequency range of the spectrum analyzer. The input signal may be electrical, acoustic pressure waves, optical light waves, and the like. The analyzers allow observers to observe various spectral components (i.e., frequency-domain characteristics) of a signal that are not easily detectable in time-domain waveform characterizations. The spectral components may include, but are not limited to: dominant frequency, power, distortion, harmonics, bandwidth, and so forth.

SUMMARY

An electronic device that is operable to communicate with a spectrum analyzer. In one or more implementations, the electronic device includes a touch-sensitive display, the touch-sensitive display configured to receive one or more inputs, a memory operable to store one or more modules, and a processor communicatively coupled to the touch-sensitive display and to the memory. The processor is operable to execute the one or more modules to cause generation of a graphical representation of frequency-domain characteristics of an input signal at the touch-sensitive display. The processor is also operable to execute the one or more modules to dynamically adjust the graphical representation of the frequency-domain characteristics of the input signal at the touch-sensitive display in response to input received at the touch-sensitive display.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

FIG. 1H illustrates an example display from the touch-sensitive display, where the display displays a graphical representation of a sub-set of the frequency-domain characteristics shown in FIG. 1G, the sub-set of frequency-domain characteristics corresponding to a window transform as defined by the single tap zoom-in gesture input denoted in FIG. 1G, and the circle region denotes a gesture corresponding to a continuous motion gesture input.

FIG. 1I illustrates an example display from the touch-sensitive display, where the display displays a graphical representation of a sub-set of the frequency-domain characteristics shown in FIG. 1H and the sub-set of frequency-domain characteristics corresponding to a window transform as defined by the continuous motion gesture input denoted in FIG. 1H.

Figure 1A:
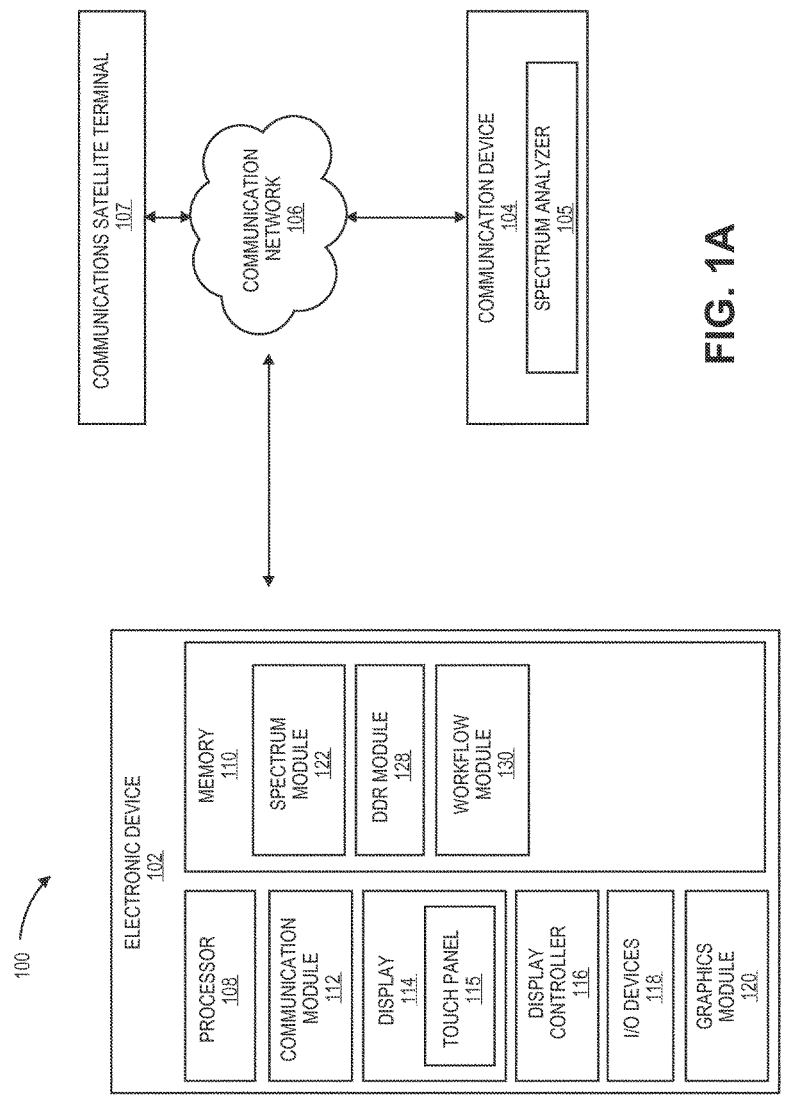
FIG. 1A is a block diagram of an electronic device in accordance with an example implementation of the present disclosure, where the electronic device is configured to communicate with a communication device having a spectrum analyzer.
Figure 1E:
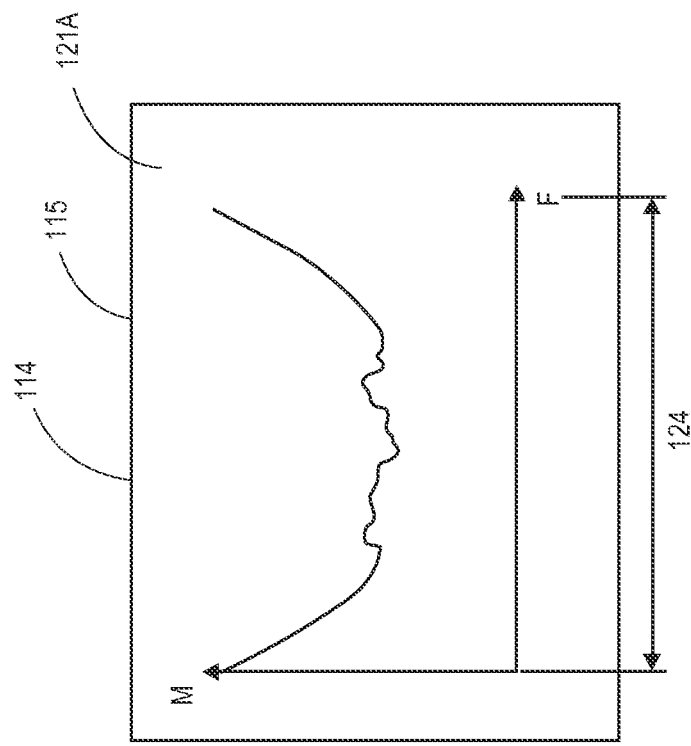
FIG. 1E illustrates another example display from the display, where the display displays a graphical representation of a sub-set of the frequency-domain characteristics shown in FIG. 1D and the sub-set of frequency-domain characteristics corresponding to a window transform as defined by the continuous gesture input denoted in FIG. 1D.
Figure 1D:
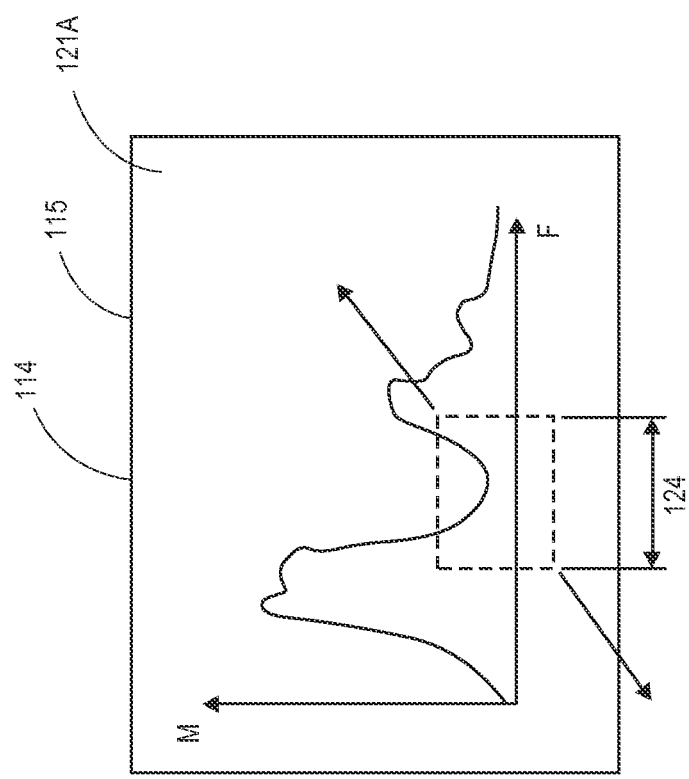
FIG. 1D illustrates an example display from a display of the electronic device, where the display displays a graphical representation of frequency-domain characteristics of the input signal.
Figure 1F:
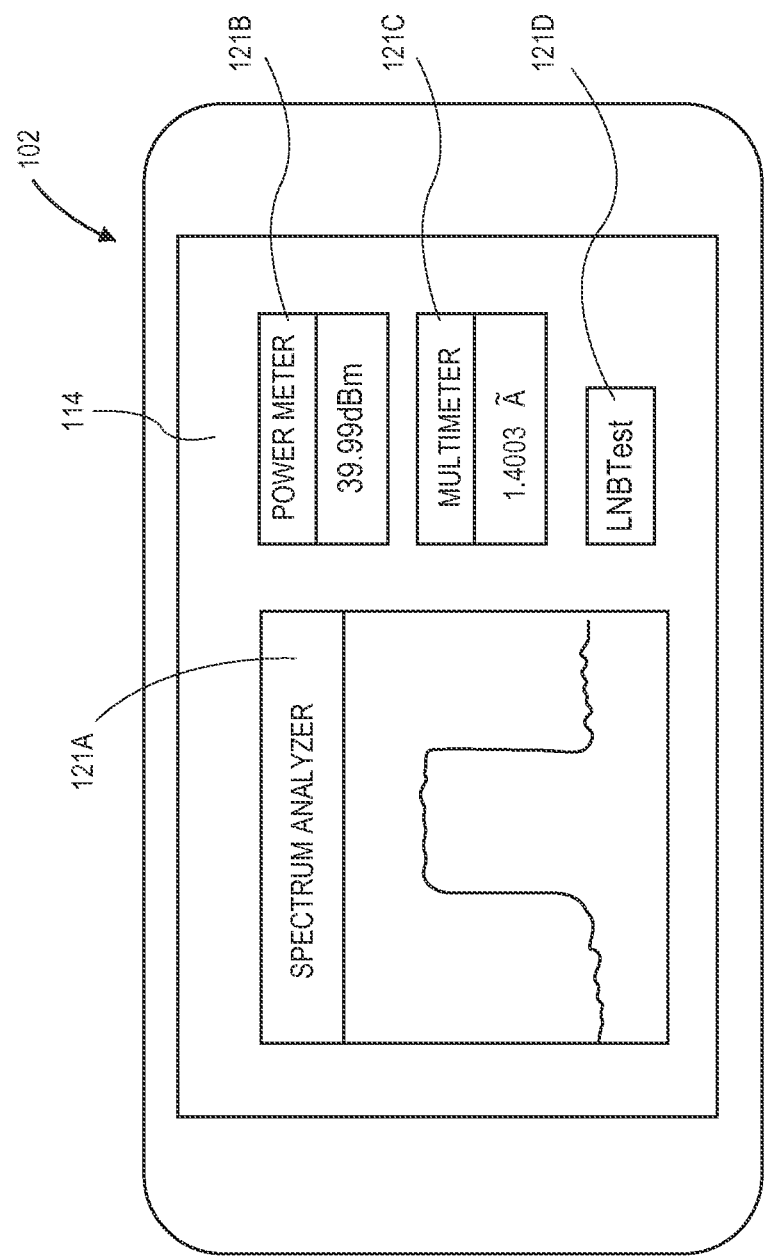
FIG. 1F illustrates another example display from the display, where the display displays a graphical representation of frequency-domain characteristics of the input signal, a graphical representation of measurements from a power meter, and a graphical representation of measurements from a multimeter.
Figure 1K:
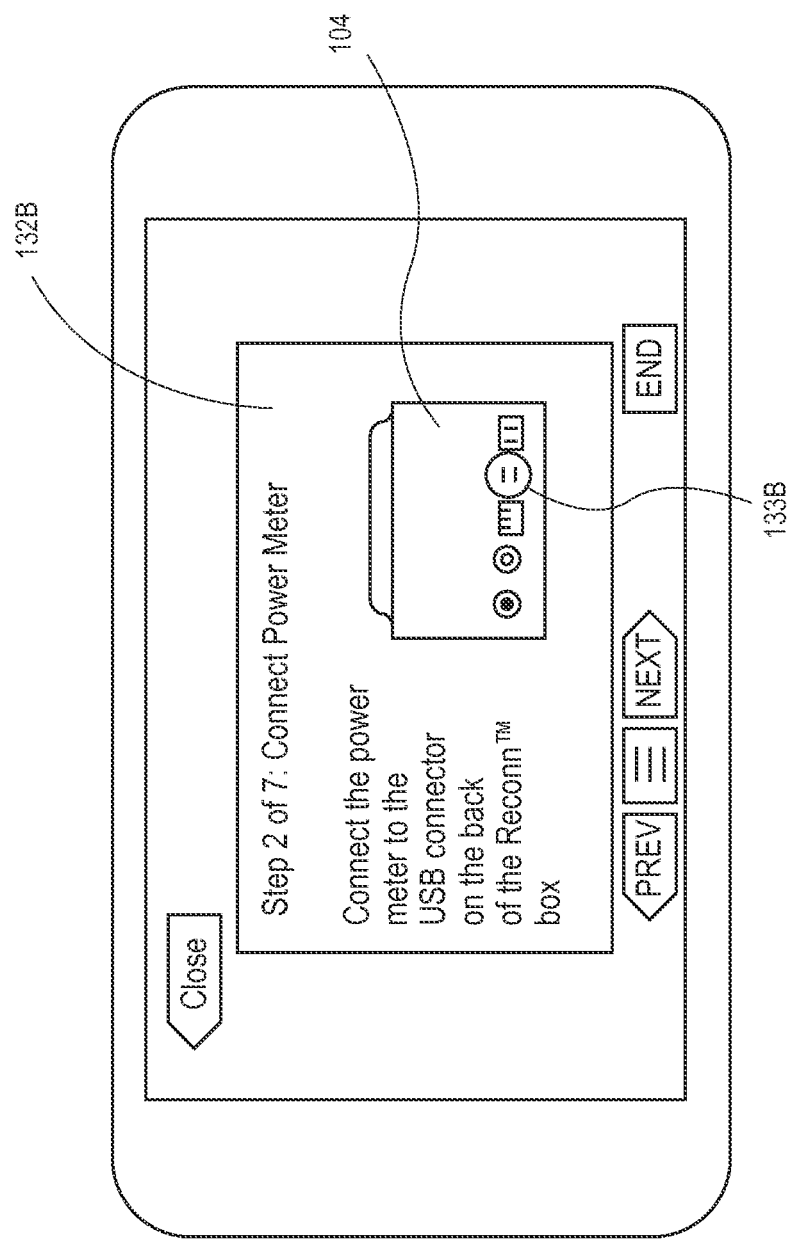
FIG. 1B is a perspective view of the electronic device in accordance with example implementation of the present disclosure, where a user is performing a continuous gesture over a touch-sensitive display of the electronic device to define a window transform and the touch-sensitive display is configured to display frequency-domain characteristics of an input signal measured by an spectrum analyzer.
FIG. 1C is a perspective view of the electronic device shown in FIG. 1B, where a graphical representation of data representing an input signal analyzed by a spectrum analyzer is displayed.
FIG. 1G illustrates an example display from the touch-sensitive display, where the display displays a graphical representation of frequency-domain characteristics of the input signal and the circle region denotes a gesture corresponding to a single tap zoom-in gesture.

FIGS. 1J and 1K illustrate example displays from the display, where the display displays a graphical representation of workflow graphics including multimedia content in accordance with an example implementation of the present disclosure.

Figure 1L:
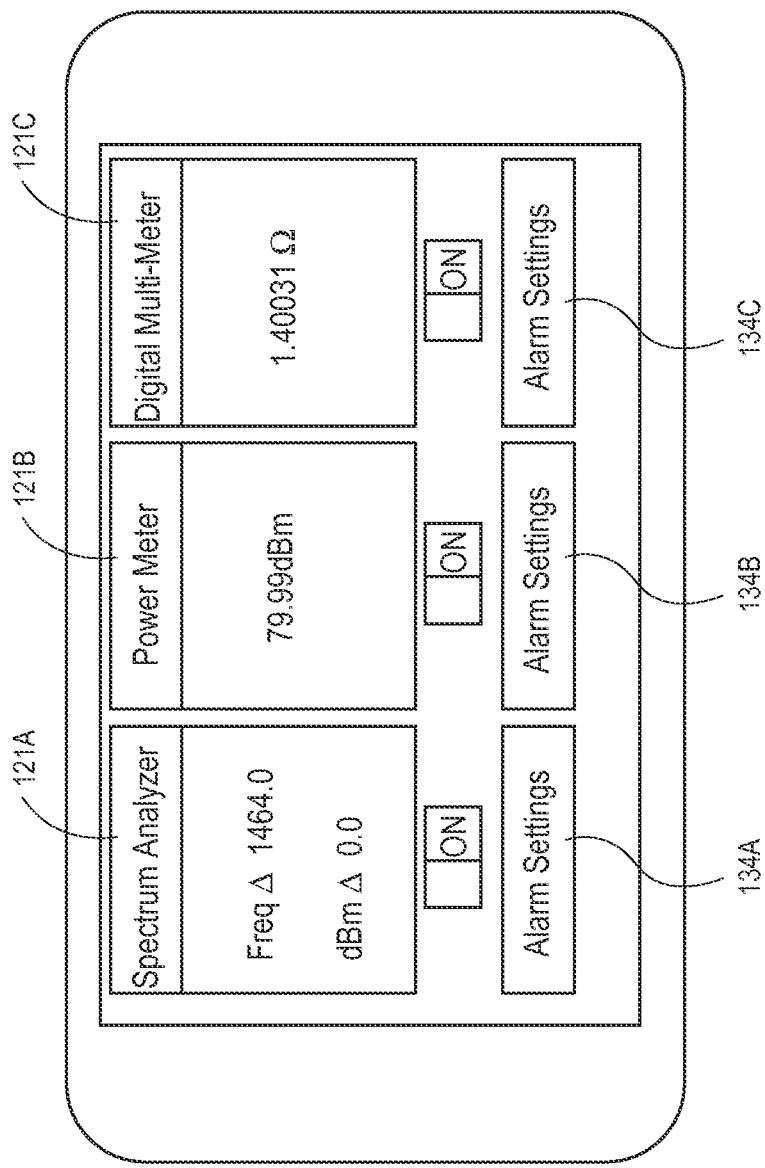

FIG. 1L illustrates another example display from the display, where the display displays a graphical representation of frequency-domain characteristics of the input signal, a graphical representation of measurements from a power meter, a graphical representation of measurements from a multimeter, and graphical representations for accessing alarm features in accordance with an example implementation of the present disclosure.

Figure 1M:
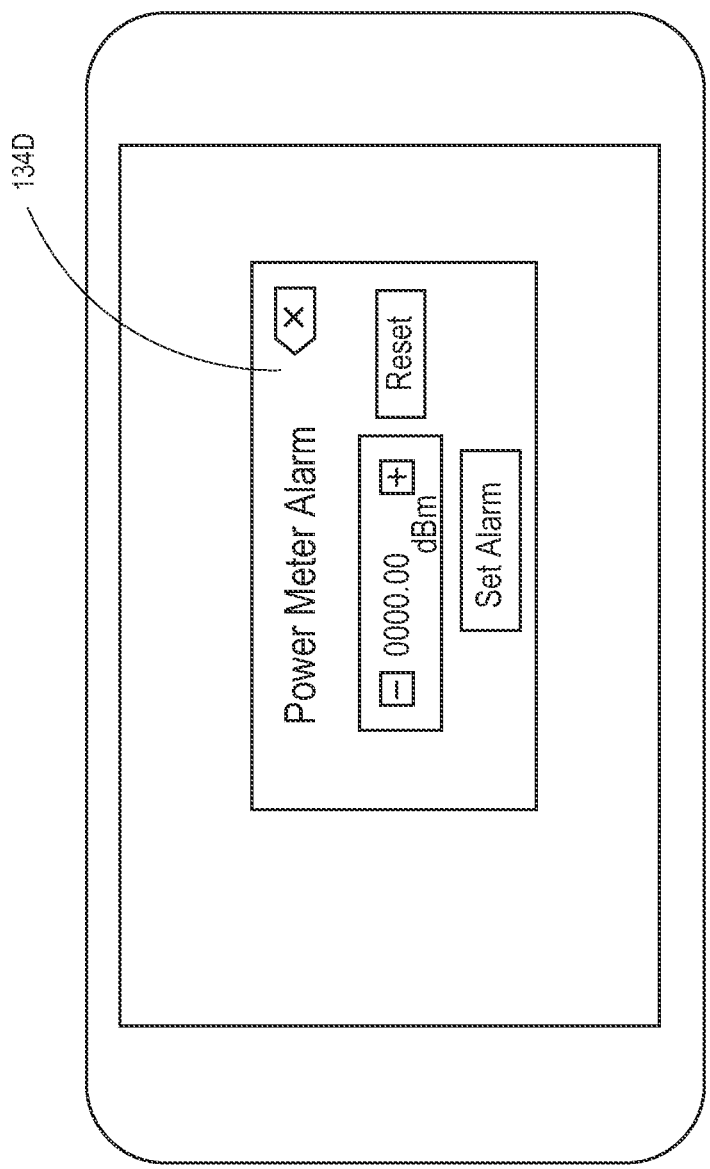

FIG. 1M illustrates another example display from the display, where the display displays a graphical representation that allows a user to manually predefine alarm settings in accordance with an example implementation of the present disclosure.

FIG. 2 illustrates an example flow diagram for providing user-input (e.g., continuous gestures) to the electronic device described in the present disclosure, wherein the touch-sensitive display is configured to provide a graphical representation of frequency-domain characteristics of an input signal measured by a spectrum analyzer, wherein the graphical representation is at least partially based upon the user-input.

DETAILED DESCRIPTION

Overview

Communication satellite (SATCOM) operators typically require a spectrum analyzer, power meter, multimeter, compass, inclinometer, global positioning system (GPS) receiver, magnetic declination map, and a mobile computing device (e.g., a laptop, etc.) to set up and maintain a satellite communications terminal. Thus, the operator typically carries multiple pieces of equipment, which may be bulky and unwieldy to move, in order to establish and to maintain the satellite communications terminal. For example, this equipment, collectively, may weigh up to one hundred and sixty-five pounds (165 lbs.).

Accordingly, a system is described that includes an electronic device that is configured to communicatively couple to a communication device that includes a spectrum analyzer. The electronic device may comprise a mobile electronic device, an embedded electronic device, or a stationary electronic device. The communication device is configured to communicatively connect to a communications satellite terminal, such as a SATCOM satellite terminal. The spectrum analyzer is configured to measure an input signal at the communications device as a function of frequency and to generate data representing frequency-domain characteristics of the input signal. In one or more implementations, the electronic device includes a touch-sensitive display, one or more processors communicatively connected to the touch-sensitive display, and a computer-readable medium configured to store instructions for execution by the processor(s). The instructions are operable to cause the processor(s) to perform operations that include causing display of a graphic representation of the frequency-domain characteristics of the input signal at the touch-sensitive display. The instructions are also operable to cause the processor to dynamically adjust the graphical representation of the frequency-domain characteristics in response to input received at the touch-sensitive display. In other implementations, the instructions may be operable to cause the processor to display workflow graphics to assist the operator (e.g., user) with operating the communications device. Thus, the system may simplify the user experience in establishing and maintaining a SATCOM communication link by reducing training time and lifecycle costs.

Example Implementations

FIG. 1 illustrates an example environment 100 in an example implementation that is operable to facilitate displaying of one or more signal characteristics within a user-defined window transform. The environment 100 includes an electronic device 102 configured to communicate with a communication device 104 over a communication network 106. The electronic device 102 may comprise a mobile computing device (e.g., a smartphone device, a tablet computing device, a laptop computing device, etc.), an embedded electronic device, or a stationary computing device (e.g., a desktop computing device, etc.). The communication device 104 is configured to communicatively interface with a communications satellite terminal via the communication network 106 as well. The communication device 104 includes a spectrum analyzer 105 that is configured to measure the magnitude of an input signal as a function of frequency within a range of frequencies (e.g., measure and generate frequency-domain characteristics of the input signal). For example, the spectrum analyzer 105 may measure a magnitude of an electrical signal (input signal) as a function of frequency. In a specific implementation, the input signal is a signal generated from a communications satellite, such as the communications satellite 107 that is communicatively connected to the communications device 104. For example, the input signal may be any signal utilized to locate, acquire, and sustain SATCOM communication links. The spectrum analyzer 105 portion of the communications device 104 may comprise circuitry, software, firmware, combinations thereof, or the like, to measure the magnitude of an electrical signal (input signal) as a function of frequency. The communication device 104 is configured to furnish data representing the frequency-domain characteristics of the measured input signal to the electronic device 102 over the communication network 106. In an implementation, the communication device 104 may furnish data representing the frequency spectrum of the input signal to the device 102. In another implementation, the communication device 104 may furnish data representing the input signal within the time-domain. In some implementations, the communication device 104 comprises includes functionality (e.g., circuitry, software, firmware, etc.) that is configured to measure a power level associated with the communication device (i.e., provides power meter functionality); to measure voltage, current, resistance, and diode voltage values associated (e.g., within) the communication device 104 (i.e., provides multimeter functionality); to provide low noise block testing functionality; and so forth.

The electronic device 102 includes a processor 108 and a memory 110. The processor 108 provides processing functionality for the electronic device 102 and may include any number of processors, micro-controllers, or other processing systems and resident or external memory for storing data and other information accessed or generated by the device 102. The processor 108 may execute one or more software programs (e.g., modules) that implement techniques described herein.

The memory 110 is an example of tangible computer-readable media that provides storage functionality to store various data associated with the operation of the electronic device 102, such as the software program and code segments mentioned above, or other data to instruct the processor 108 and other elements of the electronic device 102 to perform the steps described herein. Although a single memory 110 is shown, a wide variety of types and combinations of memory may be employed. The memory 110 may be integral with the processor 108, stand-alone memory, or a combination of both. The memory may include, for example, removable and non-removable memory elements such as RAM, ROM, Flash (e.g., SD Card, mini-SD card, micro-SD Card), magnetic, optical, USB memory devices, and so forth. In embodiments of the device 102, the memory 110 may include removable ICC (Integrated Circuit Card) memory such as provided by SIM (Subscriber Identity Module) cards, USIM (Universal Subscriber Identity Module) cards, UICC (Universal Integrated Circuit Cards), and so on.

The electronic device 102 is communicatively coupled to the spectrum analyzer 105 (e.g., in communication with the communication device 104) over a communication network 106 through a communication module 112 included in the device 102. The communication module 112 may be representative of a variety of communication components and functionality, including, but not limited to: one or more antennas; a browser; a transmitter and/or receiver; a wireless radio; data ports; software interfaces and drivers; networking interfaces; data processing components; and so forth. For example, the communication module 112 may represent radio frequency (RF) circuitry configured to receive and/or transmit electromagnetic signals. The RF circuitry is also configured to convert electrical signals to/from electromagnetic signals and communicates with the communications network 106 and other communications devices via the electromagnetic signals. RF circuitry may include, but is not limited to: an antenna system, an RF transceiver, one or more amplifiers, a tuner, one or more oscillators, a digital signal processor, a CODEC chipset, a subscriber identity module (SIM) card, memory, and so forth. In some implementations, the processor 110, the memory 112, and the graphics module 120 (described herein) may include suitable hardware to comprise a communications module 112.

The communication module 112 facilitates communication with other devices (e.g., electronic mobile devices, web servers, web clients, the communication device 104, desktop computers, laptop computers, etc.) through the communication network 106, external ports (e.g., Universal Serial Bus (USB), a FIREWIRE communication interface, etc.) included in the electronic device 102, or the like. The external ports are adapted for communicatively coupling the device 102 directly to other devices or indirectly over the communication network 106. In some embodiments, the external port is a multi-pin connector, or the like.

The communication network 106 may comprise a variety of different types of networks and connections that are contemplated, including, but not limited to: the Internet; an intranet; a satellite network; a cellular network; a mobile data network; wired and/or wireless connections; and so forth.

Wireless networks may comprise any of a plurality of communications standards, protocols and technologies, including but not limited to: Global System for Mobile Communications (GSM), Enhanced Data GSM Environment (EDGE), high-speed downlink packet access (HSDPA), wideband code division multiple access (W-CDMA), code division multiple access (CDMA), time division multiple access (TDMA), Bluetooth, Wireless Fidelity (Wi-Fi) (e.g., IEEE 802.11a, IEEE 802.11b, IEEE 802.11g and/or IEEE 802.11n), voice over Internet Protocol (VoIP), Wi-MAX, a protocol for email (e.g., Internet message access protocol (IMAP) and/or post office protocol (POP)), instant messaging (e.g., extensible messaging and presence protocol (XMPP), Session Initiation Protocol for Instant Messaging and Presence Leveraging Extensions (SIMPLE), and/or Instant Messaging and Presence Service (IMPS), and/or Short Message Service (SMS), or any other suitable communication protocol.

As shown in FIG. 1, the electronic device 102 includes a touch-sensitive display 114, which can be implemented using a liquid crystal display, an organic light emitting diode display, or the like. In some embodiments, the touch-sensitive display 114 may include a touch panel 115. The touch panel 115 may be, but is not limited to: a capacitive touch panel, a resistive touch panel, an infrared touch panel, combinations thereof, and the like. Thus, the display 114 may be configured to receive input from a user and display information to the user of the electronic device 102. For example, the display 114 displays visual output to the user. The visual output may include graphics, text, icons, video, and any combination thereof (collectively termed "graphics"). In some embodiments, some or all of the visual output may correspond to user-interface objects, further details of which are described below.

The display 114 is communicatively coupled to a display controller 116 that is configured to receive and/or transmit electrical signals to the touch-sensitive display 114. In an implementation, the touch panel 115 includes a sensor, an array of sensors, or the like, configured to accept input from a user based upon haptic and/or tactile contact. The touch panel 115, in combination with the display controller 116 (along with any associated modules and/or sets of computer-readable instructions in memory 110), detects a point of contact (or points of contact), as well as any movement or breaking of the contact, on the touch panel 115 and converts the detected contact (e.g., a finger of the user, a stylus, etc.) into electrical signals representing interactions with user-interface objects (e.g., buttons, custom views, icons, web pages, images, web page links, etc.) that are displayed through the display 114.

The electronic device 102 may further include one or more input/output (I/O) devices 118 (e.g., a keypad, buttons, a wireless input device, a thumbwheel input device, a trackstick input device, and so on). The I/O devices 118 may include one or more audio I/O devices, such as a microphone, speakers, and so on.

The electronic device 102 also includes a graphics module 120 configured to render and display graphics through the display 114. In an implementation, the graphics module 120 may be dedicated hardware configured to render and display graphics through the display 114. In another implementation, the graphics module 120 is representative of computer executable instructions stored in memory 110 and executable by the processor 108, which is configured to cause the processor 108 to initiate rendering and displaying of graphics through the display 114. Thus, the module 120 is capable of changing the intensity of graphics that are displayed. As used herein, the term "graphics" includes any object that can be displayed to a user, including without limitation text, web pages, icons (such as user-interface objects including soft keys), digital images, videos, animations and the like. In an implementation, the graphics module 120 is configured to render and display graphics representing the magnitude of an input signal versus a range of frequencies. Thus, the graphics module 120 may be configured to cause a frequency spectrum representation of a signal as measured by the spectrum analyzer 105.

The electronic device 102 includes a spectrum module 122, which is storable in memory 110 and executable by the processor 108 (e.g., a program non-transitory computer-readable medium embodying a program executable by the processor 108). The spectrum module 122 is configured to receive data representing the measured signal through the communication module 112 (e.g., data furnished by the spectrum analyzer 105 over the communication network 106). In an implementation, the spectrum module 122 is configured to determine whether the data represents a frequency spectrum of the measured signal. If the spectrum module 122 determines that the data does not represent the frequency spectrum of the measured signal (e.g., the data represents a time-domain representation of the signal), the spectrum module 122 (in combination with the processor 108) performs an analysis of the input signal to determine characteristics of the input signal. For example, the spectrum module 122 may use digital signal processing (DSP) techniques to convert time-domain characteristics of the input signal to frequency-domain characteristics (e.g., using a Fourier transform). However, the data transmitted from the spectrum analyzer 105 may already represent a frequency spectrum of the measured signal.

The spectrum module 122 is also configured to receive data (e.g., wireless signals, physical signals, TCP/IP data packets) corresponding to a gesture performed over the touch panel 115. In an implementation, the user performs a continuous gesture that defines and/or modifies a window transform. Based upon the window transform, the spectrum module 122 is configured to cause the processor 108 to initiate a display of a frequency range based upon the window transform via the touch-sensitive display 114. Thus, the touch-sensitive display 114 may display graphics representing various characteristics (e.g., frequency-domain characteristics) of the input signal as measured by the spectrum analyzer 105 in response to user-input (e.g., user-performed continuous gesture). A continuous gesture may include, but is not limited to: a single finger touch input, a multi-touch input, a pan input, and so forth. For example, the continuous gesture may include a one finger pan (e.g., an input operation to modify the displayed window transform), a two finger pinch scale, a single tap zoom in, a triple tap with one finger that corresponds to a zoom out, or the like. For example, the touch-sensitive display 114 may display the magnitude of the input signal(s) within a limited range of frequencies based upon the window transform (e.g., window transform defines a limited range of frequencies corresponding to the gesture). In an implementation, the continuous gesture may be defined as the period that a user performs a gesture within the touch-sensitive panel. For example, a continuous gesture may be considered as the period when the user initiates contact with the panel 115 to perform a pan gesture until the user de-initiates contact with the panel 115 to conclude the pan gesture. In another example, a continuous gesture may be considered as the period when the user initiates contact with the panel 115 to perform a two finger pinch scale gesture until the user de-initiates contact with the panel 115 to conclude the two finger pinch scale gesture (see FIGS. 1D and 1E). In yet another example, a continuous gesture may be considered as the period when the user initiates contact with the panel 115 to perform a single tap zoom in gesture until the user de-initiates contact with the panel 115 to conclude the single tap zoom in gesture.

As shown in FIG. 1B, when the electronic device 102 is operational, a user can provide user input (e.g., perform a gesture over the touch panel 115) to initiate a representation (e.g., a first representation) of signal characteristics (e.g., frequency-domain characteristics) captured by the spectrum analyzer 105. For example, the display controller 116 is configured to detect the gesture as the gesture is performed over the touch panel 115 and provide the data (signals) representing the gesture to the spectrum module 122. In an implementation, the user may perform a two-finger pinch scale (see FIGS. 1D and 1E) over the touch panel 115 to define a window transform. In an implementation, the window transform includes a range of frequencies 124 for which frequency-domain characteristics of an input signal can be displayed. For instance, each window transform includes a starting frequency and an ending frequency, as well as one or more intervals of frequencies occurring within the starting and ending frequencies. Thus, the window transform can include one or more frequency-domain characteristics of the input signal within the defined range of frequencies 124.

An initial frequency range (and the corresponding frequency domain characteristics of the input signal) is displayed via the display 114. In an implementation, the user may perform a two-finger pinch scale over the touch panel 115 to select a sub-set or a super-set (e.g., first sub-set or a first super-set) of frequency ranges (e.g., a user-defined window transform) occurring within the initial frequency range. In response to the user input and the user-defined window transform, the frequency domain characteristics of the input signal occurring within the sub-set or the super-set (e.g., first sub-set or the first super-set) of frequency ranges is displayed via the display 114. Additionally, the user may perform another user-input (e.g., gesture) over the touch panel 115 to initiate a second representation of the signal characteristics. For example, the user may perform a three finger tap (e.g., zoom out) to select a second sub-set (or a super-set) of frequency ranges occurring within the initial frequency range (the super-set of frequency ranges is larger than the first sub-set of frequency ranges). In response to the next gesture, the frequency domain characteristics of the input signal occurring within the second sub-set of frequency ranges is displayed via the display 114. It is contemplated that the user-input may be saved within a configuration profile and stored in memory 110 for later uses. For example, once the user initializes an application associated with the spectrum analyzer 105, a user may specify a configuration profile that includes one or more pre-defined ranges of frequencies. Thus, the configuration profile may be provided to the spectrum analyzer 105 in order to receive data representing input signal characteristics occurring within the pre-defined ranges of frequencies. Additionally, the configuration profile may further include a preset range of frequencies. Thus, the user may initiate the configuration profile to cause a display of frequency characteristics corresponding to the preset (e.g., preset manufacturing frequency range, user preset frequency range, etc.) range of frequencies.

The spectrum module 122 is configured to continually calculate parameters for the spectrum analyzer 105 based upon the dynamic window transform (e.g., continually update the range of frequencies selected as a result of the user input [e.g., the continuous gesture, etc.]). For example, once a frequency range has been selected by the user, the spectrum module 122 calculates one or more parameters associated with the new window transform (e.g., a sub-set range of frequencies, etc.). The parameters may include, but are not limited to: a central frequency, a frequency span, a reference floor, and the like. Once the parameters are calculated, the spectrum module 122 furnishes the parameters to the spectrum analyzer 105 (through the communication network 106). The spectrum analyzer 105 utilizes the furnished parameters to provide the signal data the user requested (e.g., data representing characteristics of the measured, or calculated, signal within the requested frequency range). The spectrum analyzer 105, while operational, is configured to continually measure and analyze input signals based upon the requests from the electronic device 102. In an implementation, the signal data furnished to the electronic device 102 may be stored within memory 110. The signal data may be furnished to the graphics module 120 to allow the graphics module 120 to initiate rendering and/or displaying of graphics representing frequency-domain characteristics of the input signal within the window transform. Thus, for each window transform, the graphics module 120 is configured to continually render and/or display graphics representing frequency-domain characteristics of the input signal (e.g., a temporally continuous dynamic sweep window transform) as a function of the user-defined window transform (e.g., frequency domain characteristics of the input signal occurring within the range of frequencies specified within the window transform). As shown in FIG. 1F, the module 122 may be configured to cause display of graphical representations 121A of the frequency-domain characteristics of the input signal, graphical representations 121B representing readings from a power meter (e.g., a power meter associated with the communication device 104), and graphical representations 121C representing readings from a multimeter (e.g., a multimeter associated with the communication device 104). Additionally, the module 122 may be configured to cause display of a graphical representation 121D to allow an operator to access LNB testing functionality.

It is also understood that user-inputs (e.g., the continuous gestures) change the granularity (e.g., frequency interval) of the displayed frequency range. In an implementation, the user may perform a zoom-in operation (e.g., zoom-in gesture) over the touch panel 115 to increase the granularity (e.g., narrower spacing between adjacent frequency values) between each frequency value displayed within the display 114 (e.g., the user further defines a sub-set of frequency ranges to be displayed by the display 114). Once the continuous gesture is performed, the graphics module 120 is configured to initiate rendering and/or displaying the sub-set of frequency ranges via the display 114 as defined by the gesture. It is also understood that the granularity may be decreased (e.g., greater spacing between adjacent frequency values) by one or more user inputs. Thus, as a user provides a continuous gesture over the touch panel 115, the processor 108 is configured to determine the type of gesture, calculate the window transform based upon the gesture, and cause the display 114 to display one or more representations 121A frequency-domain characteristics representing the input signal at the spectrum analyzer 105 based upon the window transform. For example, as shown in FIG. 1G, an operator may perform a single tap zoom-in gesture (the circle 123A region denotes the area where the user performs the single tap zoom-in gesture). As shown in FIG. 1H, the graphical representation area 121A where the operator performed the gesture is enlarged to illustrate an increased granularity that corresponds to the defined window transform (e.g., window transform defined by the single tap zoom-in gesture). The operator may then perform a continuous gesture corresponding to a pan gesture to re-define the window transform (see the circle 123B region denoted in FIG. 1H to represent a pan operation). As shown in FIG. 1H, the module 122 is configured to cause display of the graphical representation 121A of the frequency-domain characteristics corresponding to the re-defined window transform.

The spectrum module 122 is configured to cause the processor 108 to provide dBm data, which is calculated by the spectrum analyzer 105, to the graphics module 120, which causes the processor 108 to initiate display of graphics representing the dBm data via the touch-sensitive display 114. In an implementation, the spectrum module 122 is configured to display graphics representing the differences dBm between one or more intervals of frequency. For instance, a user may define a sub-set (or super-set) of frequencies through user-input (e.g., gestures, etc.). Once data representing the input signal characteristics occurring within the sub-set of frequencies is received from the spectrum analyzer, the module 122 is configured to calculate one or more dBm values within the sub-set of frequencies. Thus, the user may continually re-define frequency ranges displayed within the display 114, and receive dynamic presentations (e.g., graphic representations through the display 114) of the differences in frequency value between the defined user inputs, as well as the difference in dBm values within each window transform. Thus, the module 122 is configured to instruct the processor 108 to cause display of a graphic representation of frequency-characteristics of the input signal, which may convey the input signals' frequency and signal strength over time.

As shown in FIG. 1C, the user may also position one or more data marker objects 126 (e.g., user-specified positions) within the displayed frequency range to cause the spectrum module 122 to calculate one or more signal characteristics based upon positioning of the data marker objects 126. The data marker object 126 may be represented as a graphical representation conveying to the operator the operator's positioning of a data marker within the displayed representation of the frequency-domain characteristics. Thus, the data marker objects 126 may function as comparison points for the data representing the input signal. For example, a user may position a first data marker object 126A, by way of selecting the desired position by way of the touch-sensitive panel 115, to signify a first frequency of interest. The user may then position a second data marker object 126B to signify a second frequency of interest. In response, the spectrum module 122 is configured to calculate data representing signal characteristics of the signal occurring within the first frequency of interest and the second frequency of interest. Once the module 122 has calculated the data relating to the markers of interest, the module 122 is configured to cause the processor 108 and/or the display controller 116 to display a graphical representation of the data representing the signal characteristics. For example, as shown in FIG. 1C, the spectrum module 122 is configured to cause the processor 108, via the graphics module 120, to display graphics representing the frequency difference between the first data marker object 126A and the second data marker object 126B, as well as the difference in dBm between the first data marker object 126A and the second data marker object 126B. The data marker objects 126 may be utilized to determine and provide graphical representations of peak values of the input signal, with respect to the placement of the data marker object 126, as well as the delta (difference) values between the data marker objects 126.

In one or more implementations, the user may enable use of the data marker object 126 by selecting a graphic representing functionality to initiate use of the data marker object 126 (e.g., turn on the data marker 126 feature). For example, the user may select the graphic via the touch-sensitive touch panel 115 to initiate one or more subroutines defined within the spectrum module 122 (by way of the graphics module 120) to cause the processor 108 to initiate display of a first data marker object 126A. The user may transition the data marker object 126A via a continuous gesture performed over the touch panel 115 until the user positions the data marker object 126A over the desired frequency (e.g., performing a single finger input over the panel 115 until the first data marker object 126A is positioned over the graphic representing the desired frequency represented in the display 114). In an implementation, the user may position the data marker object 126A by depressing the user's finger over the panel 115. Upon the user positioning the data marker object 126A, the user can position a second data marker object 126B over the desired frequency (e.g., once the user positions the first data marker 126A, user can re-initiate the continuous gesture until the second data marker object 126B is positioned over the graphic representing the desired frequency). However, it is understood that the marker objects 126 can be positioned utilizing other methods as well.

As shown in FIG. 1A, the electronic device 102 also includes a digital data recorder (DDR) module 128. The DDR module 128 is representative of functionality to at least substantially continuously record (e.g., store) data representing the various characteristics of the input signal analyzed by the spectrum analyzer 105. The DDR module 128 may be configured in a variety of ways. For example, the DDR module 128 may be implemented in software, hardware, combinations thereof, or the like. In an implementation, the DDR module 128 is configured to cause the processor 108 to store data representing the input signal (e.g., data representing the frequency-domain characteristics) in memory 110. In another implementation, the DDR module 128 is configured to cause the processor 108 to instruct the communication module 112 to transmit the data to another computing device, such as a server, or a network of computing devices for storage purposes.

In an implementation, the DDR module 128 causes the processor 108 to store the data representing the input signals for a continuous interval of time. For example, the DDR module 128 may cause storage of the data until there is insufficient storage to store additional data at which point it starts writing from the beginning of the buffer (e.g., a circular buffer). In another example, the DDR module 128 may cause storage of the data until the user de-initiates the DDR module 128 (e.g., user disconnects device 102 from communication network 106).

The DDR module 128 allows for temporal display of the spectrum analyzer 105 data. In an implementation, the user may cause the electronic device 104 to playback the recorded data. For example, the user may initiate the DDR module 128 to cause the module 128 to cause the processor 108, as well as the graphics module 120, to instruct the display 114 to display graphical representations of the recorded data representing the input signal. Thus, the DDR module 128 is configured to cause continuous graphical representations of the recorded data over one or more time intervals, which allows the user to view a frame-by-frame change to the input signal. In an implementation, the user may also use a graphical representation of a toolbar 129 to manually transition between frames. The toolbar 129 may include a graphical representation of a slider (e.g., a directional input) in which the user can place the user's finger over to allow the user to manually transition between one or more frames. For example, the slider may be utilized to move temporally within the graphical representations of the stored data.

As shown in FIG. 1A, the electronic device 102 also includes a workflow module 130 that represents functionality to present a configurable workflow that includes multimedia content. In a specific example, the workflows present multimedia content to guide the user through the use of the various components within the environment 100 (e.g., the electronic device 102, the spectrum analyzer 105, etc.). The workflow module 130 is storable in memory 110 and executable by the processor 108. In an implementation, as shown in FIGS. 1J and 1K the user may initiate the workflow module 130 through a graphical representation of the module 130 presented via the display 114. For example, upon initiation of the module 130, the workflow module 130 causes the processor 108 to initiate presentation (e.g., display) of a series of graphics 132A (see FIG. 1J), 132B (see FIG. 1K) to assist the user in setting up the system 100. For example, the workflow module 130 may cause the processor 108 to present various graphics to guide the user through the process of using the spectrum module 122, in combination with the spectrum analyzer 105, to verify and to test the communications link between electronic device 102 and the communication device 104, as well as to verify and to test the communications link between the communication device 104 and the communications satellite terminal 107. In an implementation, the workflow module 130 is configured to cause the processor to present graphics 132A, 132B that includes information for properly connecting the communications device 104 (e.g., signifying proper connectors with a graphic delineators 133A, 133B as shown in FIGS. 1J and 1K, respectively). In another example, the workflow module 130 is configured to also cause the processor 108 to initiate presentation of a series of graphics, such as the graphics 132A, 132B to guide the user through setting up and initiating the spectrum analyzer 105. Additionally, the workflow module 130 may allow the user to create customizable workflow diagrams based upon the user's previous experiences, other industry knowledge, or the user's own troubleshooting knowledge. In an implementation, the workflow module 130 may be implemented with a scripting language, or the like. It is understood that the workflow graphics may include any type of multimedia content and are not limited to content for assisting the user in setting up the system 100.

As shown in FIGS. 1L and 1M, the module 122 may be further configured to instruct the processor 108 to display graphical representations 134A, 134B, 134C representing access to alarm setting functionalities. In an implementation, the operator may wish to set an alarm feature when a predefined threshold is reached. For example, the predefined threshold may represent when a predefined dBm delta value is reached, and so forth. As shown in FIG. 1M, the display 114 may present a graphic 134D to the operator to allow the operator to predefine the value at which the user wishes to be alerted. The module 122 may be configured to cause the processor to issue one or more alerts when the predefined alarm threshold value is reached. The alerts may be in the form of an audible alert issued from the electronic device 102, a visual alert issued from the electronic device 102, combinations thereof, or the like. In an implementation, the graphical representations 134A may provide access to the operator to set an alert value corresponding to the spectrum analyzer 105; the graphical representations 134B may provide access to the operator to set an alert value corresponding to the power meter (see FIG. 1M); and the graphical representation 134C may provide access to the operator to set an alert value corresponding to the multimeter. It is understood that other types of instruments may be utilized as well.

Example Processes

FIG. 2 illustrates an example process 200 for rendering and/or displaying input characteristics as a function of a user-defined window transform. When a user initially initiates displaying of an input signal that is measured and analyzed by the spectrum analyzer 105 (e.g., the user initiates an application [an "app"] corresponding to viewing characteristics of the input signal), the electronic device 102 may include an initial configuration profile (e.g., stored in memory 110) for defining an initial window transform. For instance, the configuration profile may include a pre-defined frequency range to furnish to the spectrum analyzer 105. In turn, the spectrum analyzer 105 furnishes signal data representing characteristics of the measured input signal occurring within the pre-defined, or the pre-set (e.g., via the configuration profiles), frequency range to the electronic device 102 for display by the display 114 (e.g., display a first representation of the signal). The spectrum analyzer 105 may continually furnish input signal data occurring within the pre-defined frequency range for display by the touch-sensitive display 114 until the device 102 receives user-input to define another frequency range (e.g., provides a zoom-in gesture, zoom-out gesture, etc.) or to terminate the application associated with the spectrum analyzer 105.

As shown in FIG. 2, a user initiates a gesture (Block 202) over the touch screen of the electronic device. The gesture may include, but is not limited to: a one finger pan, a two finger pinch scale, a single tap zoom in, a triple tap that corresponds to a zoom out, or the like. As described above, a user can provide user-input (e.g., performing a continuous gesture) to define a new window transform within the display 114 of the electronic device 102. Once the new window transform is defined, the window transform is calculated (Block 204). The window transform represents frequency-domain characteristics of the input signal within a defined range of frequencies (e.g., a user may perform a zoom-in gesture to define a sub-set of frequency ranges). In an implementation, the module 122 calculates the lower and upper limit frequency values of the window transform, which are provided to the spectrum analyzer 105.

In response to a user-defined window transform, one or more parameters for the spectrum analyzer are calculated (Block 206). For example, the spectrum module 122 may calculate a central frequency, a frequency span, a resolution bandwidth, a video bandwidth (VBW), and/or a reference floor associated with the user-defined window transform. For instance, the spectrum module 122 may receive data representing the frequency-domain characteristics of the input signal and calculate the parameters (e.g., central frequency, the frequency span, the resolution bandwidth, the video bandwidth, and/or the reference floor) from the signal data. In an implementation, the electronic device 102 is configured to transmit the parameters to the spectrum analyzer 105.

The spectrum analyzer is then configured with the new parameters (Block 208). In an implementation, the spectrum analyzer 105 may be configured with the parameters such that one or more subsequent signal analyses (e.g., spectrum analyzer sweeps) are performed based upon the parameters. For example, in an implementation, the spectrum analyzer 105 may only be configured to transmit data representing frequency-domain characteristics of the input signal based upon the parameters to the device 102. The electronic device is then configured to request one or more updated analyses (e.g., spectrum analyzer sweeps) from the spectrum analyzer (Block 210). In an implementation, the electronic device 102 is configured to request input signal data from the spectrum analyzer 105. In turn, the analyzer 104 is configured to furnish (e.g., transmit) the input signal data, which is based upon the parameters provided to the analyzer 104, to the device 102.

The electronic device receives the input signal data (e.g., data from the spectrum analyzer sweep) from the spectrum analyzer and stores the input signal data in memory for review (Block 212). The device 102 is configured to receive the input signal data from the spectrum analyzer 105 over the communication network 106, which then may be stored in memory 110. Once the input signal data is stored in memory 110, the graphics module 120 is configured to access the data to initiate rendering and/or display a graphical representation of the input signal data (e.g., graphical representation of the frequency-domain characteristics of the input signal that occur within the parameters). The display is configured to provide a graphical representation of the input signal data (Block 214).

As shown in FIG. 2, a determination is made to whether the user continued the gesture without breaking contact with touch screen (Decision Block 216). If the user continues contact with the touch panel 115 (YES from Decision Block 216), the spectrum module 122 continues to adjust the parameters based upon the updating of the window transform. For example, a user may continue adjusting the window transform (via the gesture), which continues adjusting the parameters furnished to the spectrum analyzer 105. If the user discontinues contact with the touch panel 115 (NO from Decision Block 216), the device 102 continues receiving input signal data (and generating graphical [e.g., temporal] representations of the input signal data) based upon the parameters generated as a result of the previous gesture.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims. A person skilled in the art will recognize that portions of the present disclosure may be implemented in hardware, software, firmware, combinations thereof, and so forth.

What is claimed is:

1. A system for analyzing and displaying signal characteristics of a measured signal transmitted as input signal data, wherein the system comprises:
   an electronic device comprising:
      a display, wherein the display is configured to receive one or more user inputs; wherein the display comprises a touch sensitive screen; wherein the display is configured to dynamically adjust a graphical representation of one or more frequency-domain characteristics of a measured signal based on the user input received through the display; further wherein the user input received through the display functions to initiate, select and control the execution of the dynamic adjustment to the graphical representation of the one or more frequency-domain characteristics of the measured signal;
      a memory operable to store one or more modules; and
      a processor communicatively coupled to the display and to the memory, wherein the processor is configured to generate the graphical representation of the one or more frequency-domain characteristics of the measured signal at the display;
      a spectrum module, wherein the spectrum module is configured to determine whether the input signal data represents a frequency spectrum of the measured signal; wherein when the spectrum module determines that the input signal data does not represent a frequency spectrum of the measured signal, the spectrum module performs analysis of the input signal data to determine one or more frequency-domain characteristics of the measured signal;
      wherein the spectrum module is configured to receive window transform data from the display;
      further wherein the spectrum module is configured to cause the processor to display a selected frequency range of the measured signal based on the received window transform data from the display;

further wherein the spectrum module is configured to transmit the selected frequency range to a remote spectrum analyzer;

further wherein the remote spectrum analyzer receives the selected frequency range and the input signal data;

further wherein the remote spectrum analyzer determines a plurality of signal characteristics of the measured signal within the selected frequency range;

further wherein the spectrum module is configured to receive and cause the display of the plurality of signal characteristics determined by the remote spectrum analyzer; wherein the plurality of signal characteristics comprise: a central frequency, a frequency span, and a resolution bandwidth;

further wherein the spectrum module receives updated user input from the display and requests updated signal characteristics from the remote spectrum analyzer;

further wherein the display is configured to receive inputs defining a first data marker object and a second data marker object, wherein the first data marker object identifies a first frequency of interest and the second data marker object identifies a second frequency of interest;

further wherein the spectrum module is configured to calculate data representing a signal characteristic of the measured signal occurring within the first frequency of interest and the second frequency of interest;

wherein the spectrum module is further configured to transmit data representing signal characteristics of the measured signal occurring within the first frequency of interest and the second frequency of interest to the display.

* * * * *